(12) United States Patent
Kamath

(10) Patent No.: US 6,958,622 B2
(45) Date of Patent: Oct. 25, 2005

(54) SCAN-MODE INDICATION TECHNIQUE FOR AN INTEGRATED CIRCUIT

(75) Inventor: Gautham Kamath, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 122 days.

(21) Appl. No.: 10/647,623

(22) Filed: Aug. 25, 2003

(65) Prior Publication Data

US 2005/0050417 A1 Mar. 3, 2005

(51) Int. Cl.$^7$ ............................................. H03K 19/00
(52) U.S. Cl. ............................... 326/16; 326/9; 326/14
(58) Field of Search ...................................... 326/8–16

(56) References Cited

U.S. PATENT DOCUMENTS 6,597,191 B2 * 7/2003 Oosawa et al. ............. 324/763
2004/0095182 A1 * 5/2004 Tomari et al. .............. 327/417

* cited by examiner

*Primary Examiner*—Anh Q. Tran
(74) *Attorney, Agent, or Firm*—Steven Lin, Esq.

(57) ABSTRACT

An integrated circuit and method for indicating the integrated circuit to enter into a scan mode are disclosed. A designated signal, such as an analog supply signal, for an analog block of an integrated circuit is utilized for indicating entry of a digital block of the integrated circuit into a scan mode. Operations of the analog block and the digital block are generally independent from each other during scan mode. Prior to the digital block utilizing the designated signal, voltage rails for the designated signal are resolved with the voltage rails of a digital supply signal for the digital block.

16 Claims, 4 Drawing Sheets

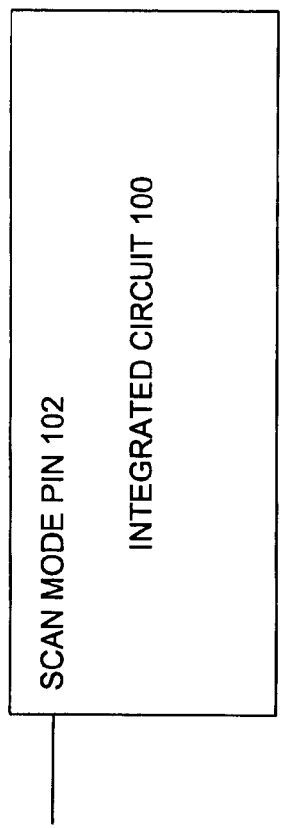
FIGURE 1 - PRIOR ART
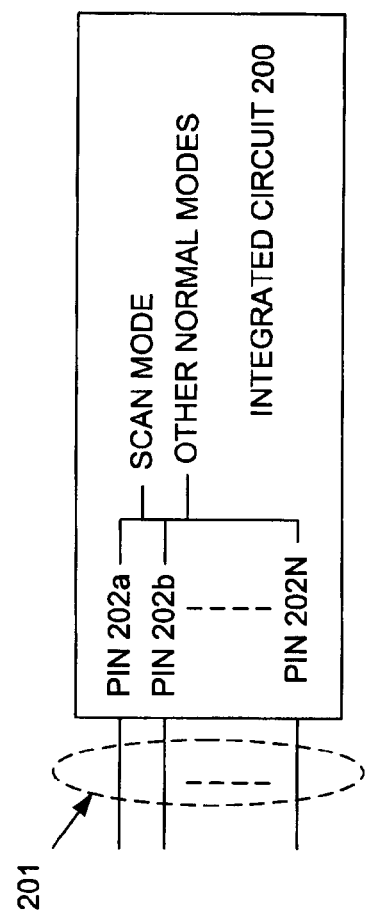
FIGURE 2 - PRIOR ART

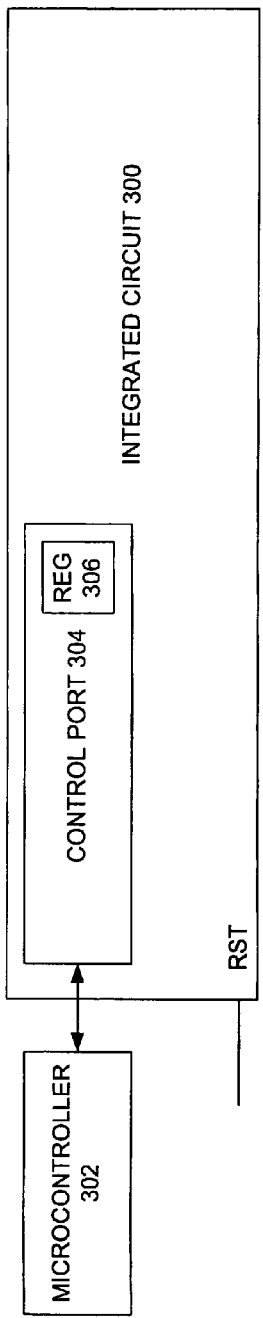
FIGURE 3A - PRIOR ART
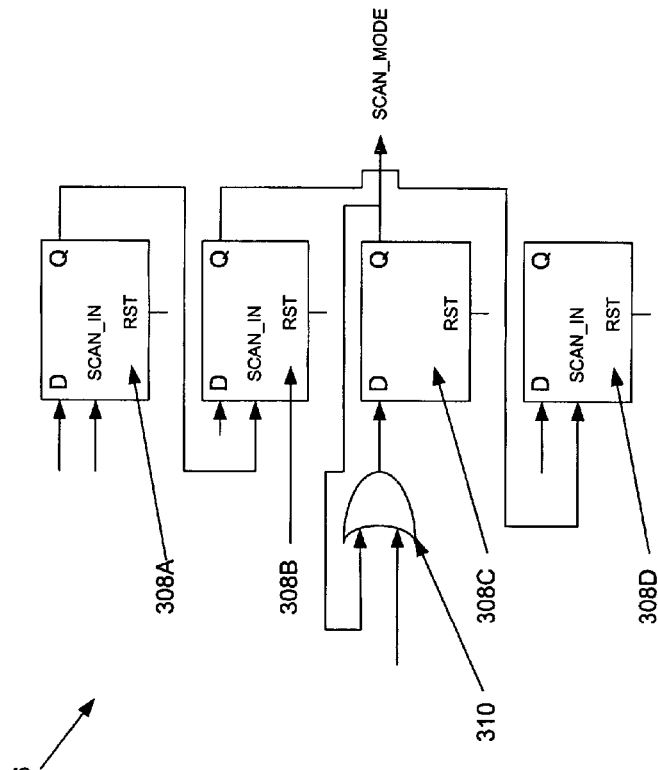
FIGURE 3B - PRIOR ART

SCAN-MODE INDICATION TECHNIQUE FOR AN INTEGRATED CIRCUIT

BACKGROUND OF THE INVENTION

1. Field of the Invention

The present invention relates to an integrated circuit technique, and, more particularly, to a technique for testing an integrated circuit. More specifically, the present invention relates to a technique for indicating an integrated circuit to enter a scan mode.

2. Description of Related Art

A full scan operation is a critical production test feature for an integrated circuit. However, an integrated circuit needs to be able to switch from a normal operational mode to a scan mode. However, entry of an integrated circuit into scan mode must be controlled in such a way that the part is not accidentally placed into scan mode.

The simplest way of accomplishing such scan mode control is to provide a dedicated pin on the integrated circuit for such an operation. FIG. 1 shows an integrated circuit 100 with a dedicated scan mode pin 102 according to the prior art. Scan mode pin 102 is solely reserved for signaling the integrated circuit into a scan mode. Larger chips, such as a system-on-a-chip, can accommodate a dedicated scan mode pin since it has extra pins to spare. However, smaller chips, such as small mixed-signal chips, typically have pin counts in the order of eight to twenty-eight pins, generally without any pins to spare.

A technique for providing scan mode control without requiring a dedicated or additional pin is shown in FIG. 2. FIG. 2 shows an integrated circuit 200 with an N-bit bus 201 coupled to an N number of pins 202a, 202b, . . . 202N, which are already existing pins and are not dedicated to scan mode, according to the prior art, and in which N is a positive integer. Pins 202a, 202b, . . . 202N are static mode pins. Static mode pins are pins that are either typically hard tied to a supply/ground or change in value only during global reset or power-down (e.g. do not change in value during normal operation) of integrated circuit 200. The technique involves using unused or a reserved combination of pins 202a, 202b, . . . and/or 202N, which then signals integrated circuit 200 to enter into scan mode. A disadvantage of this technique is that the unused/reserved combination of pins 202a, 202b, . . . and/or 202N used for indicating integrated circuit 200 for entering scan mode can no longer be used for some other operation, feature, mode, or purpose that may be added in the future. Another disadvantage is that some level of fault coverage on the combinational logic that the input pins directly drive may be lost.

Another prior art technique for providing scan mode control without requiring a dedicated pin is shown in FIGS. 3A and 3B. FIG. 3A shows an integrated circuit 300 with a control port 304 having a control port register (REG) 306 in which one of the bits in REG 306 is the scan mode indicator according to the prior art. A microcontroller 302 for controlling control port 304 is coupled to control port 304. Integrated circuit 300 also has a reset pin RST. FIG. 3B shows a detailed diagram of control port register (REG) 306 according to the prior art. REG 306 has a number of flip flops 308A, 308B, 308C, and 308D. Flip flop 308C is designated as the flip flop to provide the scan mode indicating bit.

Each of flip flops 308A, 308B, 308C, and 308D has an input D, an output Q, and a reset input that receives the reset signal from reset pin RST. Each of flip flops 308A, 308B, and 308D also has an input SCAN_IN. As shown in FIG. 3B, flip flop 308A receives data input D and provides output Q as the input SCAN_IN to flip flop 308B. Flip flop 308B also receives respective data input D and, in turn, provides output Q as the input SCAN_IN to flip flop 308D. Flip flop 308C is the scan mode indicating flip flop. An OR gate receives as inputs the fed-back output Q of flip flop 308C and the data input D that would normally be directly fed as input D into flip flop 308C. The output of the OR gate is instead fed as the input D into flip flop 308C. Flip flop 308C provides output Q as the SCAN_MODE signal. As an example, if SCAN_MODE signal is low, then integrated circuit 300 operates in the normal mode and normally-fed data input D is provided to flip flop 308C (e.g., the data input D ORed with a low SCAN_MODE signal equals the data input D). However, if SCAN_MODE signal is high, then integrated circuit 300 is signified to operate in the scan mode (e.g., the data input D ORed with a high SCAN_MODE signal equals the high SCAN_MODE signal). The high SCAN_MODE signal is provided as input D into flip flop 308C. The output of flip flop 308C provides a signal indicating that integrated circuit 300 is to operate in the scan mode.

Since control port 304 is similar to other digital components and is also scanned in the scan mode, flip flop 308C, which is associated with providing the scan mode indicating bit, must be set up and operated in an unique, particular way. As discussed earlier, the data logic value, input D, which normally is input directly to flip flop 308C, is instead fed into an OR gate, and an OR operation is performed on this input D with the SCAN_MODE signal. The output of flip flop 308C provides the scan mode indicator. Furthermore, flip flop 308C should not be made part of the scan chain. Flip flop 308C should be operated in this particular manner in order to ensure that integrated circuit 300 stays in the scan mode regardless of what the scan chain is doing. Integrated circuit 300 is able to exit scan mode through use of a global reset or powerdown signal since flip flop 308C generally has an asynchronous reset that is connected to the global reset.

However, scan mode control through use of a control port register is limited especially in situations in which the hardware does not have a control port. Also, specific attention and effort needs to be focused on ensuring that the flip flop designated for scan mode indication is not made part of the scan chain. Furthermore, the scan tool is generally not programmed on how the integrated circuit will enter the scan mode. Thus, the correct tester pattern needs to be manually generated. The correct tester pattern writes to the control port and it is appended to the beginning of the scan pattern generated by an Automatic Tester Pattern Generation Tool. Also, since the reset pin RST can return integrated circuit 300 to the normal operational mode when in the scan mode, faults on the reset line coupled to reset pin RST cannot be detected.

Thus, the present invention recognizes the desire and need for providing a simpler and improved technique for indicating an integrated circuit to enter the scan mode. The present invention further recognizes the desire and need to provide such a technique without having to utilize designated or additional pins of the integrated circuit. The present invention also recognizes the desire and need to provide a scan mode entry technique that avoids the use of a combination of pre-existing pins. The present invention additionally recognizes the desire and need of a scan mode entry technique that avoids the use of a control port and control port register. The present invention overcomes the problems and disadvantages in accordance with the prior art.

SUMMARY OF THE INVENTION

An integrated circuit and method for indicating the integrated circuit to enter into a scan mode are disclosed. A designated signal, such as an analog supply signal, for an analog block of an integrated circuit is utilized for indicating entry of a digital block of the integrated circuit into a scan mode. Operations of the analog block and the digital block are generally independent from each other in scan mode. Prior to the digital block utilizing the designated signal, voltage rails for the designated signal are resolved to the voltage rails of a digital supply signal for the digital block.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 1 is a block diagram of an exemplary integrated circuit having a designated scan mode pin according to the prior art;

FIG. 2 is a block diagram of an exemplary integrated circuit having a combination of pins for indicating entry into scan mode according to the prior art;

FIG. 3A is a block diagram of an exemplary integrated circuit having a control port with a control port register in which one of the bits is utilized to indicate entry into the scan mode according to the prior art;

FIG. 3B is a more detailed block diagram of the control port register in FIG. 3A according to the prior art;

DETAILED DESCRIPTION OF THE INVENTION

An integrated circuit and method for indicating the integrated circuit to enter into a scan mode are disclosed. A designated signal, such as an analog supply signal, for an analog block of an integrated circuit is utilized for indicating entry of a digital block of the integrated circuit into a scan mode.

Figure 4:
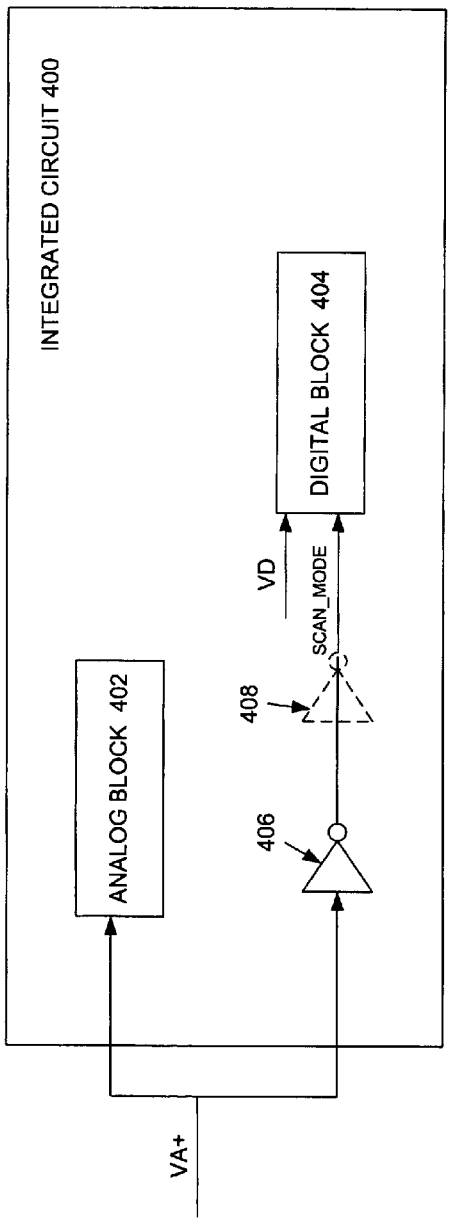
FIG. 4 is a block diagram of an exemplary integrated circuit that utilizes a supply of an analog block to indicate the digital block to enter into the scan mode according to the present invention.

With reference now to FIG. 4, an exemplary integrated circuit 400 is shown. Integrated circuit 400 has an analog block 402 and a digital block 404. Digital block 404 utilizes an analog supply signal VA+, which is a designated signal for analog block 402, in order to indicate entry of digital block 404 into a scan mode. Operations of analog block 402 and digital block 404 are generally independent or mutually exclusive from each other in scan mode.

However, before digital block 404 can use the designated signal of analog block 402, the voltage rails of analog supply signal VA+ must be resolved to the voltage rails of a digital supply signal, such as digital supply signal VD, of digital block 404. Thus, integrated circuit 400 has an exemplary inverter 406, which receives the analog supply signal VA+ as its input, and provides an output signal to digital block 404. The output signal from inverter 406 is the signal SCAN_MODE for indicating entry of digital block 404 into the scan mode. Thus, inverter 406 resolves the voltage rails of analog supply signal VA+ to voltage rails of a digital supply signal VD of digital block 404 by inverter 406 level shifting the voltage rails of analog supply signal VA+ from analog block 402 to digital supply signal VD of digital block 404.

Figure 5:
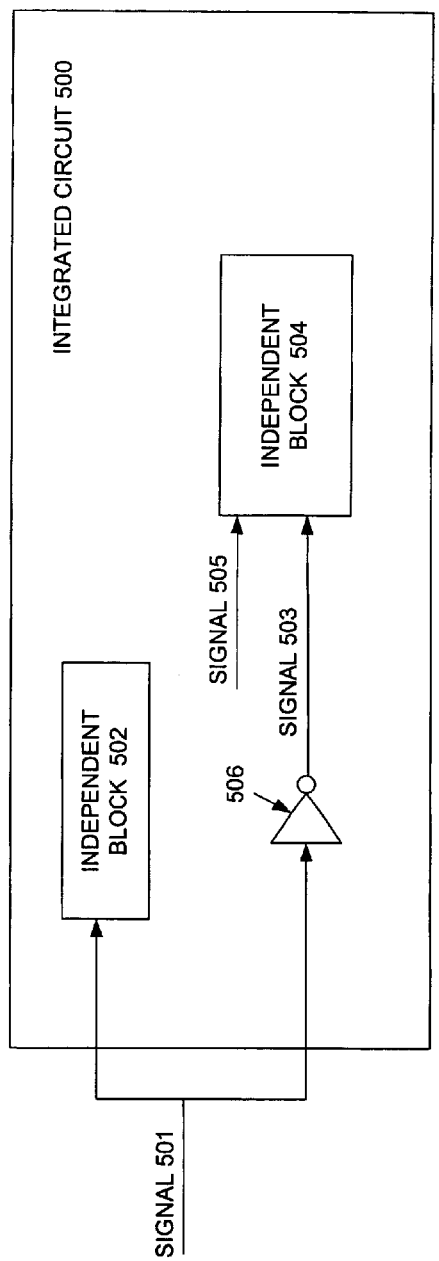
FIG. 5 is a block diagram of an exemplary integrated circuit that has a first independent block that is generally independent in operation from a second independent block when the second block is in a special mode and in which a signal designated for one purpose for the first independent block is generally utilized for putting the second independent block into the special mode.

Referring now to FIG. 5, another exemplary integrated circuit 500 is shown. Integrated circuit 500 shows that the present invention can be described in more generic terms. Integrated circuit 500 has an independent block 502 and another independent block 504 in which the operations of independent blocks 502 and 504 are generally independent or mutually exclusive when independent blocks 502 and 504 are operating in a special mode. A signal 501 is solely designated for one purpose for independent block 502. Signal 501 of independent block 502 is also sent to independent block 504. Independent block 504 uses signal 501 for another or different purpose.

However, before independent block 504 can use designated signal 501 of independent block 502, voltage rails of signal 501 must be resolved to the voltage rails of another designated signal, such as signal 505, of independent block 504. Thus, integrated circuit 500 has an inverter 506, which receives designated signal 501 as its input, and provides an output signal to independent block 504. The output signal from inverter 506 is a signal 503 for indicating execution of another purpose or operation for independent block 504. Thus, inverter 506 resolves the voltage rails of designated signal 501 of independent block 502 to voltage rails of another signal 505 of independent block 504 by inverter 506 level shifting the voltage rails from signals of independent block 502 to signals of independent block 504. Integrated circuit 400 parallels integrated circuit 500 as follows: Analog block 402 is an independent block 502; Digital block 404 is an independent block 504; Inverter 406 is an inverter 506; Analog supply signal VA+ is a signal 501; Digital supply signal VD is a signal 505; Signal SCAN_MODE is a signal 503.

Inverter 406 is now discussed in more detail. In one embodiment, integrated circuit 400 may be set up so that the scan mode is activated upon a high value. In this scenario, analog supply signal VA+ of FIG. 4 is set to a low analog value (e.g., low voltage rail of analog supply signal VA+). Inverter 406 inverts the low analog value of analog supply signal VA+ to a high digital value (e.g., high voltage rail of digital supply signal VD). Inverter 406 provides the high digital value of signal SCAN_MODE to digital block 404. The high digital value signifies that digital block 404 is to enter into the scan mode.

In another embodiment, integrated circuit 400 may be set up so that the scan mode is activated upon a low value. In this other scenario, integrated circuit 400 is generally the same in features and operation as described earlier except that an additional inverter 408, which is shown in dotted lines in FIG. 4, is coupled between inverter 406 and digital block 404. Inverter 408 inverts the high digital value to a low digital value (e.g., low voltage rail of digital supply signal VD), and the low digital value is fed to digital block 404 to signify entry into the scan mode.

As one example, voltage rails for analog supply signal VA+ are at zero volts and 2.5 volts while voltage rails for digital supply signal VD are at zero volts and 3.3 volts. If integrated circuit 400 is configured to trigger entry into scan mode based on an active high value, then the zero volt rail for analog supply signal VA+ needs to be resolved to the 3.3 volt rail of digital supply signal VD and the 2.5 volt rail of analog supply signal VA+ needs to be resolved to the zero volt rail of digital supply signal VD. On the other hand, if integrated circuit 400 is configured to trigger entry into scan mode based on an active low value, then the zero volt rail for analog supply signal VA+ is resolved to the zero volt rail of digital supply signal VD and the 2.5 volt rail of analog supply signal VA+ is resolved to the 3.3 volt rail of digital supply signal VD. The resolving of these voltage rails are accomplished by use of inverter 406 in the active high scenario and use of both inverters 406 and 408 in the active low scenario. In either scenario, latch up problems caused by the transition from a voltage rail of analog supply signal VA+ to a voltage rail of digital supply signal VD are avoided by the use of level shifters and/or buffers on the interface signals between analog block 402 and digital block 404.

Figure 6:
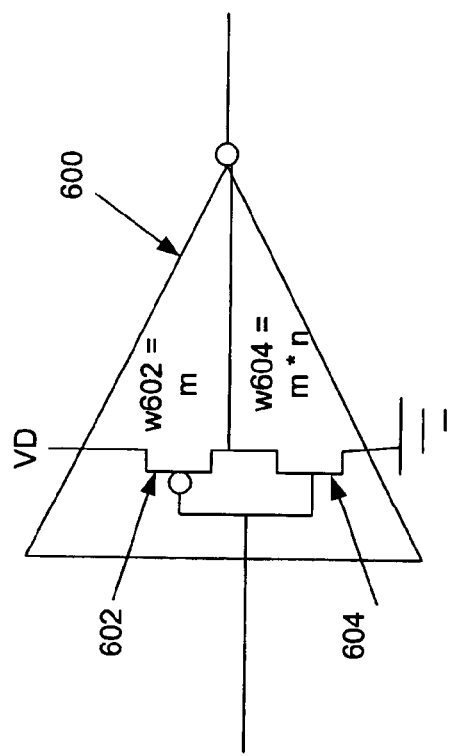
FIG. 6 shows an exemplary inverter that can be used in the integrated circuits of FIGS. 4 and 5.

In the event that the high voltage rail of analog supply signal VA+ is much smaller in value than the high voltage rail of digital supply signal VD (e.g., high VA+=2.5 volts and high VD=5.0 volts), inverter 406 can be designed to have a trip point that is lower than its normal value. In other words, inverter 406 or 506 can be designed to trigger the inverting operation at a voltage value that is at a lower-than-normal value. With reference now to FIG. 6, an exemplary inverter 600 is shown. Inverter 600 can be used as inverter 406 in integrated circuit 400 or as inverter 506 in integrated circuit 500.

Inverter 600 has transistor gates 602 and 604. Normally, an inverter would have gates of generally equal size. Inverter 600 has been designed so that the widths of transistor gates 602 and 604 have been re-sized and so that inverter 600 has a trip point that is lower than an otherwise normal value. Gate 602 has a width w602 equal to m while gate 604 has a width w604 equal to m*n where m is an m number of gate measurement units and n is a positive integer multiple such that width w604 is greater than width w602.

Figure 7:
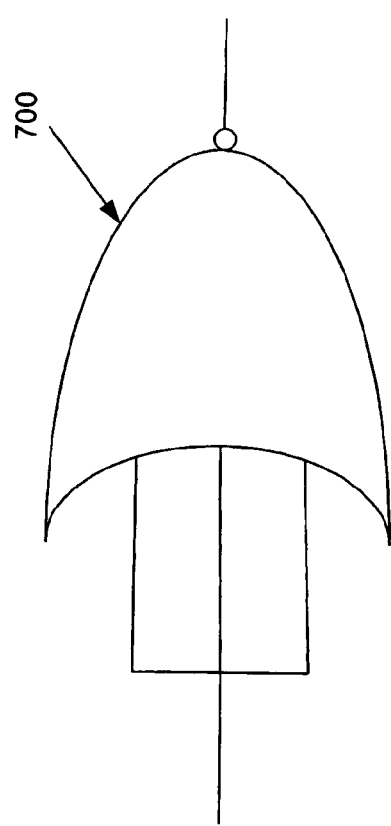
FIG. 7 shows an exemplary NOR gate that can be used as the inverter in the integrated circuits of FIGS. 4 and 5.

Referring now to FIG. 7, an alternative inverter 700 can be used instead of inverter 600 in the scenario that the high voltage rail of analog supply signal VA+ is much smaller in value than the high voltage rail of digital supply signal VD. Inverter 700 can instead be used as inverter 406 in integrated circuit 400 or inverter 506 in integrated circuit 500. Inverter 700 is basically a NOR gate having multiple inputs. All of the multiple inputs are tied together and connected to analog supply signal VA+ or signal 501. Inverter 700 provides an output signal that is signal SCAN_MODE for integrated circuit 400 and signal 503 for integrated circuit 500.

Thus, the present invention provides a simpler and improved technique for indicating an integrated circuit to enter the scan mode. The present invention provides such a technique without having to utilize designated or additional pins of the integrated circuit. The present invention provides a scan mode entry technique that avoids the use of a combination of pre-existing pins. The present invention provides a scan mode entry technique that avoids the use of a control port and control port register. The present invention avoids losing fault coverage on certain digital portions of the integrated circuit. The present invention overcomes the problems and disadvantages in accordance with the prior art.

While the invention has been particularly shown and described with reference to a preferred embodiment, it will be understood by those skilled in the art that various changes in form and detail may be made therein without departing from the spirit and scope of the invention.

What is claimed is:

1. A method for indicating an integrated circuit to enter into a scan mode, comprising:

utilizing a designated signal for an analog block of an integrated circuit for indicating entry of a digital block of the integrated circuit into a scan mode wherein operations of the analog block and the digital block are generally independent from each other in the scan mode; and prior to the digital block utilizing the designated signal, resolving voltage rails for the designated signal with other voltage rails of a digital supply signal for the digital block.

2. The method according to claim 1, wherein the designated signal is an analog supply signal and wherein resolving voltage rails further comprises in response to the scan mode being activated upon a high value:

setting the analog supply signal to a low analog value;

inverting, by an inverter, the low analog value to a high digital value; and providing the high digital value to the digital block to signify entry into the scan mode.

3. The method according to claim 2, wherein alternatively the scan mode is activated upon a low value and further comprising:

inverting, by another inverter, the high digital value to a low digital value; and providing the low digital value to the digital block to signify entry into the scan mode.

4. The method according to claim 3, further comprising:

in the event that the analog supply signal is much lower than the digital supply signal, setting a trip point of the inverter to a lower-than-normal value.

5. The method according to claim 4, wherein setting a trip point of the inverter to a lower-than-normal value further comprises:

re-sizing widths of transistor gates of the inverter.

6. An integrated circuit, comprising:

an analog block; and a digital block coupled to the analog block; and wherein a designated signal for the analog block is utilized for indicating entry of the digital block into a scan mode; and wherein operations of the analog block and digital block are generally independent from each other in the scan mode; and wherein prior to the digital block utilizing the designated signal, voltage rails for the designated signal are resolved with other voltage rails of a digital supply signal for the digital block.

7. The integrated circuit according to claim 6, further comprising:

an inverter coupled before an input of the digital block; and wherein the designated signal is an analog supply signal; and wherein, in response to the scan mode being activated upon a high value, the analog supply signal is set to a low analog value, the inverter inverts the low analog value to a high digital value, and the high digital value is provided to the digital block to signify entry into the scan mode.

8. The integrated circuit according to claim 7, further comprising:
- another inverter coupled after the inverter and before the input of the digital block; and
- wherein alternatively the scan mode is activated upon a low value, the another inverter inverts the high digital value to a low digital value, and the low digital value is provided to the digital block to signify entry into the scan mode.

9. The integrated circuit according to claim 8, wherein, in the event that the analog supply signal is much lower than the digital supply signal, a trip point of the inverter is set to a lower-than-normal value.

10. The integrated circuit according to claim 9, wherein the trip point of the inverter is set to a lower-than-normal value by re-sizing widths of transistor gates of the inverter.

11. A method for utilizing in an integrated circuit a signal that is designated for one purpose for one block for another purpose by another block, comprising:
- sending a signal that is solely designated for one purpose for one block to another block; and
- using the signal, by the another block, for another purpose wherein operations of the one block and the another block are generally mutually exclusive during a special mode of operation; and
- prior to the another block using the signal, resolving voltage rails of the signal with other voltage rails of another signal for the another block.

12. The method according to claim 11, wherein the one block is an analog block, the one purpose is supply of an analog supply signal to the analog block, the another purpose is indication of entry into a scan mode, and the another block is a digital block.

13. The method according to claim 12, further comprising:
- prior to the digital block using the analog supply signal, resolving voltage rails of the analog supply signal with other voltage rails of a digital supply signal for the digital block.

14. The method according to claim 13, wherein resolving voltage rails further comprises in response to the scan mode being activated upon a high value:
- setting the analog supply signal to a low analog value;
- inverting, by an inverter, the low analog value to a high digital value; and
- providing the high digital value to the digital block to signify entry into the scan mode.

15. The method according to claim 14, wherein alternatively the scan mode is activated upon a low value and further comprising:
- inverting, by another inverter, the high digital value to a low digital value; and
- providing the low digital value to the digital block to signify entry into the scan mode.

16. The method according to claim 15, further comprising:
- in the event that the analog supply signal is much lower than the digital supply signal, setting a trip point of the inverter to a lower-than-normal value.

* * * * *